(12) United States Patent
Miller et al.

(10) Patent No.: US 11,211,230 B2
(45) Date of Patent: Dec. 28, 2021

(54) GAS FLOW SYSTEM

(71) Applicant: Applied Materials, Inc., Santa Clara, CA (US)

(72) Inventors: Keith A. Miller, Mountain View, CA (US); Wei W. Wang, Santa Clara, CA (US); Alexander Erenstein, San Jose, CA (US); John J. Mazzocco, San Jose, CA (US)

(73) Assignee: APPLIED MATERIALS, INC., Houston, TX (US)

( * ) Notice: Subject to any disclaimer, the term of this patent is extended or adjusted under 35 U.S.C. 154(b) by 22 days.

(21) Appl. No.: 16/838,987

(22) Filed: Apr. 2, 2020

(65) Prior Publication Data

US 2020/0335310 A1 Oct. 22, 2020

Related U.S. Application Data

(60) Provisional application No. 62/836,866, filed on Apr. 22, 2019.

(51) Int. Cl.
*H01J 37/32* (2006.01)
*C23C 14/34* (2006.01)
*C23C 14/50* (2006.01)
*B25J 18/00* (2006.01)

(52) U.S. Cl.
CPC ......... *H01J 37/32449* (2013.01); *B25J 18/00* (2013.01); *C23C 14/34* (2013.01); *C23C 14/50* (2013.01); *H01J 37/32642* (2013.01); *H01J 37/32715* (2013.01); *H01J 2237/006* (2013.01); *H01J 2237/202* (2013.01)

(58) Field of Classification Search
None
See application file for complete search history.

(56) References Cited

U.S. PATENT DOCUMENTS

| | | | |
|---|---|---|---|
| 6,022,461 A | 2/2000 | Kobayashi et al. | |
| 6,224,724 B1 | 5/2001 | Licata et al. | |
| 6,296,747 B1 * | 10/2001 | Tanaka | C23C 14/345 |
| | | | 204/298.07 |
| 6,627,056 B2 | 9/2003 | Wang et al. | |
| 7,444,955 B2 | 11/2008 | Boardman et al. | |
| 2002/0023831 A1 | 2/2002 | Iwase et al. | |

(Continued)

OTHER PUBLICATIONS

International Search Report dated Jul. 28, 2020 for Application No. PCT/US2020/026468.

*Primary Examiner* — Jason Berman
(74) *Attorney, Agent, or Firm* — Patterson + Sheridan LLP; B. Todd Patterson

(57) ABSTRACT

A gas flow system is provided, including a gas flow source, one or more gas inlets, one or more gas outlets, a gas flow region, a low pressure region, wherein the low pressure region is fluidly coupled to the one or more gas outlets, a high pressure region, and a gap. The one or more gas inlets are fluidly coupleable to the gas flow source. The gas flow region is fluidly coupled to the one or more gas inlets and the one or more gas outlets. The gap fluidly couples the gas flow region to the high pressure region. The high pressure region near the targets allows for process gas interactions with the target to sputter onto the substrate below. The low pressure region near the substrate prevents unwanted chemical interactions between the process gas and the substrate.

19 Claims, 7 Drawing Sheets

(56) References Cited

U.S. PATENT DOCUMENTS

2004/0262155 A1    12/2004   Lombardi et al.
2014/0141624 A1*   5/2014   Abarra ................ H01J 37/3447
                                                                                438/778
2016/0027623 A1*   1/2016   Ishihara .............. C23C 14/3464
                                                                                204/298.07

* cited by examiner

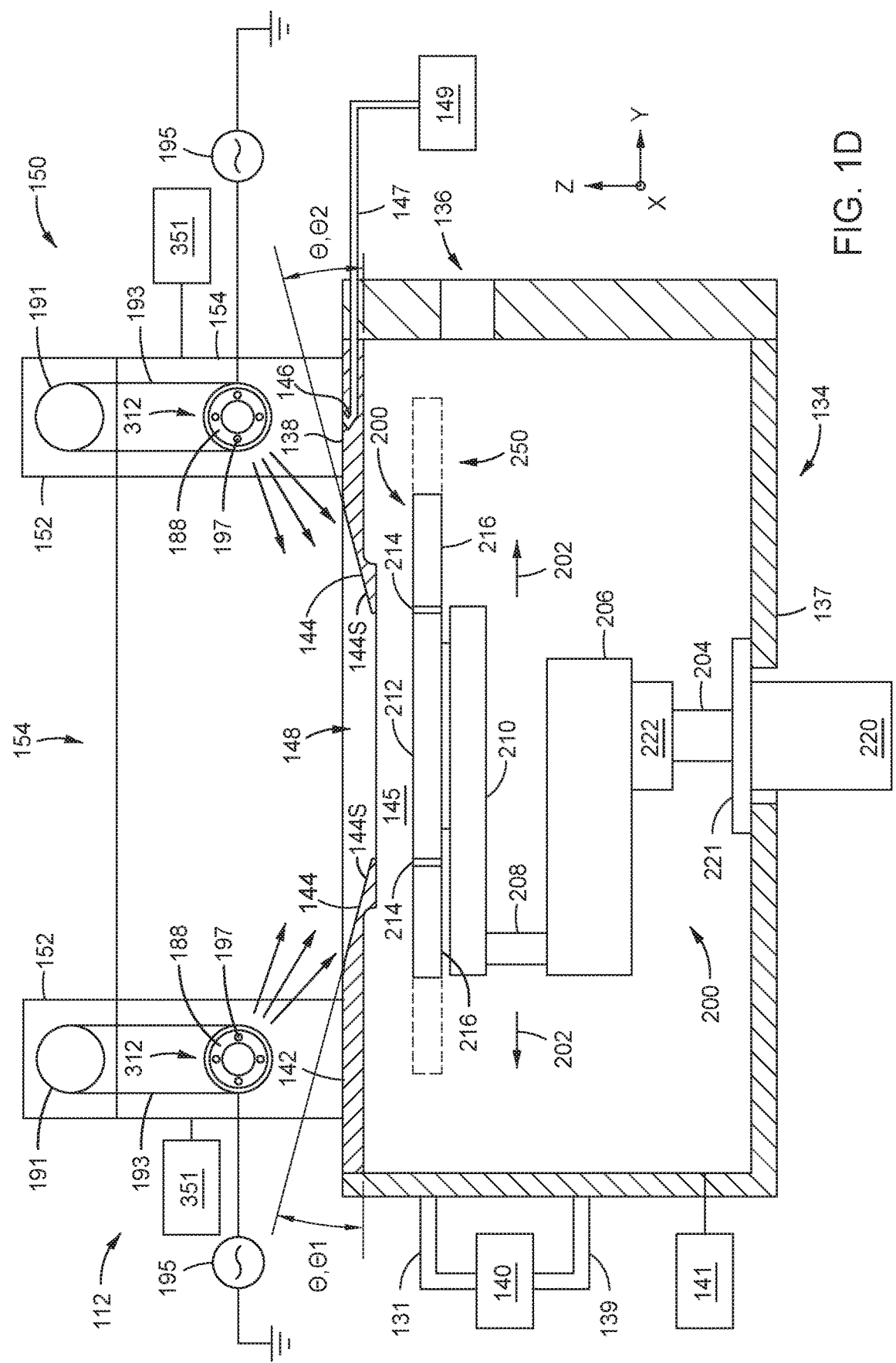

GAS FLOW SYSTEM

CROSS-REFERENCE TO RELATED APPLICATIONS

This application claims priority to U.S. Provisional Patent Application No. 62/836,866, filed Apr. 22, 2019, which is hereby incorporated by reference in its entirety.

BACKGROUND

Field

Embodiments of the invention relate to an apparatus and, more specifically, to a gas flow system.

Description of the Related Art

Integrated circuits (IC) may include more than one million micro-electronic devices such as transistors, capacitors, and resistors. Modern ICs are manufactured in processing chambers using a multitude of steps, such as sputter deposition. Sputter deposition is a physical vapor deposition (PVD) method of thin film deposition by sputtering. This involves ejecting material from a target onto a substrate, such as a silicon wafer. Sputtered atoms ejected from the target have a wide energy distribution, typically up to tens of eV. The sputtered ions can ballistically fly from the target in straight lines and impact energetically on substrates within the processing chamber, on walls of the processing chamber, or on other components of the processing chamber.

Sputtering is used extensively in the semiconductor industry to deposit thin films of various materials in IC processing. Thin antireflection coatings on glass for optical applications are also deposited by sputtering. Because of the low substrate temperatures used, sputtering is an ideal method to deposit contact metals for thin-film transistors. Another familiar application of sputtering is low-emissivity coatings on glass, used in double-pane window assemblies. The coating is a multilayer containing silver and metal oxides such as zinc oxide, tin oxide, or titanium dioxide.

However, although high gas pressures are necessary for supply of process gas to the targets, low pressures must be maintained at the surface of the substrate, in order to maintain desired film stoichiometry and integrity. Current gas flow systems in the art are designed to provide high gas pressures at the targets, but are not equipped to also provide low gas pressures at the substrate. Instead, current gas flow systems in the art also maintain high gas pressures at the substrate, which interfaces with the desired film growth from sputtering. In addition, many gas flow systems are maintained at very high pressures with no easy way for pressure venting, causing structural damage to components of the gas flow system due to stress caused by high process gas pressure.

Therefore, there is a need for gas flow systems that can simultaneously maintain high pressures at a portion of a processing chamber, and low pressure at a different portion of the same chamber.

SUMMARY

In one embodiment, a gas flow system is provided, including one or more gas inlets fluidly coupleable to a gas flow source, one or more gas outlets, a gas flow region, a low pressure region, and a high pressure region fluidly coupled to the gas flow region via a gap between a first plate and a second plate. The low pressure region is fluidly coupled to the one or more gas outlets. The gas flow region is fluidly coupled to the one or more gas inlets and the one or more gas outlets. The first plate separates the gas flow region from the high pressure region.

In another embodiment, a processing system is provided, including a gas flow system and a moveable substrate support. The gas flow system includes a gas flow source, one or more gas inlets, one or more gas outlets, a gas flow region, a low pressure region, and a high pressure region. The low pressure region is fluidly coupled to the one or more gas outlets. The one or more gas inlets are fluidly coupled to the gas flow source. The gas flow region is fluidly coupled to the one or more gas inlets and the one or more gas outlets. The high pressure region is fluidly coupled to the gas flow region via a gap between a first plate and a second plate. The first plate separates the gas flow region from the high pressure region. The moveable substrate support is disposed in the low pressure region. The moveable substrate support is configured to move along a movement path.

In another embodiment, a processing chamber is provided, including a gas flow system, a moveable substrate support, a top panel having an aperture disposed therethrough, one or more chamber walls, and a chamber bottom, wherein an interior volume is at least partially bounded by the top panel, one or more chamber walls, and the chamber bottom. The gas flow system includes a gas flow source, one or more gas inlets, one or more gas outlets, a gas flow region, a low pressure region, and a high pressure region. The low pressure region is fluidly coupled to the one or more gas outlets. The one or more gas inlets are fluidly coupled to the gas flow source. The gas flow region is fluidly coupled to the one or more gas inlets and the one or more gas outlets. The gap fluidly couples the gas flow region to the high pressure region. The moveable substrate support includes a support structure, a robot arm connected to the support structure, and a robot actuator connected to the robot arm. The support structure includes a substrate support surface, a ring surrounding the substrate support surface, and a halo. The robot actuator is configured to move the robot arm and the support structure along a movement path. The top panel separates the high pressure region from the low pressure region. The gap is formed between the top panel and a side plate separating the gas flow region from the high pressure region. The aperture fluidly couples the high pressure region to the low pressure region. The moveable substrate support is disposed in the interior volume. The interior volume contains the low pressure region.

The high pressure region near the targets allows for the desired pressure for proper interaction between the process gas and the target, such that the desired material is sputtered onto the substrate. The low pressure region near the substrate prevents unwanted interaction between the process gas and the substrate, which inhibits desired film growth.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 1D illustrates a schematic side view of the processing chamber of FIG. 1B, according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a gas flow system that maintains high pressure in a high pressure region of a process chamber, and low pressure in a low pressure region of a process chamber. Both regions are fluidly coupled to a gas flow region. A gap between process chamber components allows for gas flow between the gas flow region and the high pressure region, while not allowing unwanted deposition to reach the gas flow region. A vacuum pump maintains low pressure in the low pressure region where a substrate is located, such that unwanted chemical reactions between process gas and the substrate are minimized. The process gas at a target in the high pressure region allows for the desired interaction between the process gas and the target, such that the material from the target is sputtered onto the substrate surface. Embodiments of the disclosure provided herein may be especially useful for, but are not limited to, a gas flow system in a sputtering process chamber.

As used herein, the term "about" refers to a +/−10% variation from the nominal value. It is to be understood that such a variation can be included in any value provided herein.

Figure 1A:
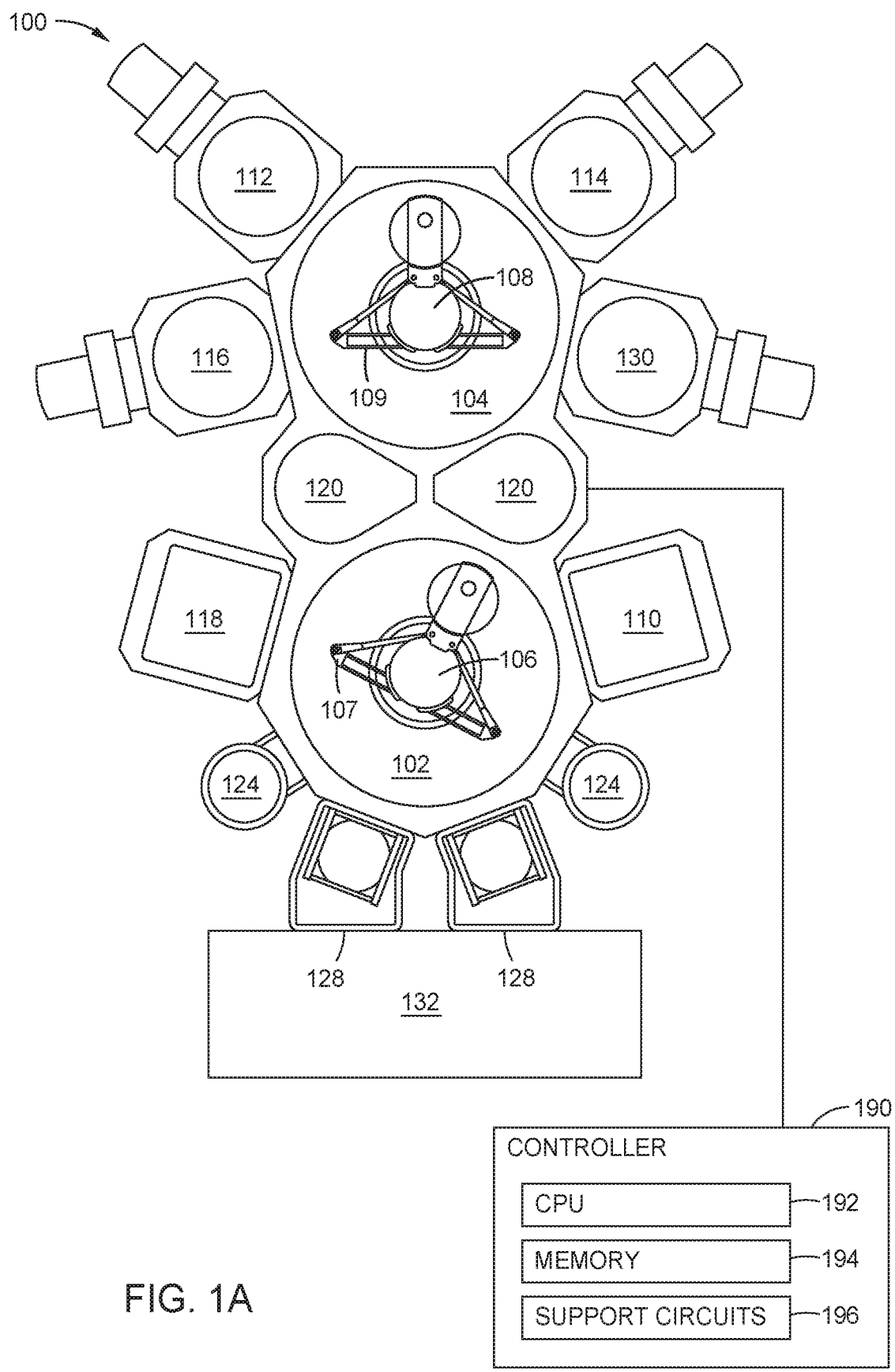
FIG. 1A illustrates a schematic top view of a processing platform, according to one embodiment.

FIG. 1A illustrates a schematic top view of a processing platform 100, according to one embodiment. As shown, the processing platform 100 includes first and second transfer chambers 102, 104, transfer robots 106, 108 positioned in the first and second transfer chambers 102, 104, respectively, and processing chambers 110, 112, 114, 116, 118, 130 disposed on the first and second transfer chambers 102, 104. The first and second transfer chambers 102, 104 are central vacuum chambers that interface with adjacent processing chambers 110, 112, 114, 116, 118, 130. The first transfer chamber 102 and the second transfer chamber 104 are separated by pass-through chambers 120, which can include cool down or pre-heating chambers. The pass-through chambers 120 also can be pumped down or ventilated during substrate handling when the first transfer chamber 102 and the second transfer chamber 104 operate at different pressures. For example, the first transfer chamber 102 can operate between about 100 mTorr and about 5 Torr, such as about 40 mTorr, and the second transfer chamber 104 can operate between about $1 \times 10^{-5}$ Torr and about $1 \times 10^{-10}$ Torr, such as about $1 \times 10^{-7}$ Torr.

The first transfer chamber 102 is coupled with two degas chambers 124, two load lock chambers 128, chemical vapor deposition (CVD) or rapid thermal processing (RTP) chambers 110, 118, and the pass-through chambers 120. Substrates (not shown) are loaded into the processing platform 100 through the load lock chambers 128. For example, a factory interface module 132, if present, would receive one or more substrates, e.g., wafers, cassettes of wafers, or enclosed pods of wafers, from either a human operator or an automated substrate handling system. The factory interface module 132 can open the cassettes or pods of substrates, if applicable, and move the substrates to and from the load lock chambers 128. The processing chambers 110, 112, 114, 116, 118, 130 receive the substrates from the transfer chambers 102, 104, process the substrates, and allow the substrates to be transferred back into the transfer chambers 102, 104.

Each of the processing chambers 110, 112, 114, 116, 118, 130 is isolated from the transfer chambers 102, 104 by an isolation valve which allows the processing chamber to operate at a different level of vacuum than the transfer chambers 102, 104 and prevents any gases being used in the processing chamber from being introduced into the transfer chambers 102, 104. The load lock chambers 128 are also isolated from the first transfer chamber 102 with isolation valves. Each load lock chamber 128 has a door which opens to the outside environment, e.g., opens to the factory interface module 132. In normal operation, a cassette loaded with substrates is placed into the load lock chamber 128 through a door from the factory interface module 132 and the door is closed. The load lock chamber 128 is then evacuated to the same pressure as the first transfer chamber 102 and the isolation valve between the load lock chamber 128 and the first transfer chamber 102 is opened. The transfer robot 106 in the first transfer chamber 102 is moved into position and one substrate is removed from the load lock chamber 128. The load lock chamber 128 is preferably equipped with an elevator mechanism so as one substrate is removed from the cassette, the elevator moves the stack of substrates in the cassette to position another substrate in the transfer plane so that it can be positioned by the transfer robot 106.

The transfer robot 106 in the first transfer chamber 102 then rotates with the substrate so that the substrate is aligned with a processing chamber position. The processing chamber 110 or 118 is flushed of any toxic gases, brought to the same pressure level as the first transfer chamber 102, and the isolation valve is opened. The transfer robot 106 then moves the substrate into the processing chamber 110 or 118 where it is removed from the transfer robot 106. The transfer robot 106 is then retracted from the processing chamber 110 or 118 and the isolation valve is closed. The processing chamber 110 or 118 then goes through a series of operations to execute a specified process on the substrate. When complete, the processing chamber 110 or 118 is brought back to the same environment as the first transfer chamber 102 and the isolation valve is opened. The transfer robot 106 removes the substrate from the processing chamber 110 or 118 and then either moves it to another processing chamber 110 or 118 for another operation or replaces it in the load lock chamber 128 to be removed from the processing platform 100 when the entire cassette of substrates has been processed.

The transfer robots 106, 108 include robot arms 107, 109, respectively, that support and move the substrate between different processing chambers. The transfer robot 106 moves the substrate between the degas chambers 124 and the processing chambers 110, 118 for deposition of a material thereon.

The second transfer chamber 104 is coupled to a cluster of processing chambers 112, 114, 116, and 130. The processing chambers 112, 114, 116, and 130 are physical vapor deposition (PVD) chambers for depositing materials, according to one embodiment. The CVD-processed substrates are moved from the first transfer chamber 102 into the second transfer chamber 104 via the pass-through chambers 120. Thereafter, the transfer robot 108 moves the substrates between one or more of the processing chambers 112, 114, 116, 130 for material deposition and annealing as required for processing.

While not shown, a plurality of vacuum pumps is disposed in fluid communication with each transfer chamber and each of the processing chambers to independently regulate pressures in the respective chambers. The pumps can establish a vacuum gradient of increasing pressure across the apparatus from the load lock chamber to the processing chambers.

Alternatively or in addition, a plasma etch chamber, such as a Decoupled Plasma Source chamber (DPS™ chamber) manufactured by Applied Materials, Inc., of Santa Clara, Calif., can be coupled to the processing platform 100 or in a separate processing platform for etching the substrate surface to remove unreacted metal after PVD metal deposition and/or annealing of the deposited metal. For example, in forming cobalt silicide from cobalt and silicon material by an annealing process, the etch chamber can be used to remove unreacted cobalt material from the substrate surface.

Other etch processes and apparatus, such as a wet etch chamber, can be used in conjunction with the process and apparatus described herein.

A controller 190, such as a programmable computer, is connected to the processing platform 100 to control the movement of the robots 106, 108 and the motion of the substrate between the various processing chambers 110, 112, 114, 116, 118, 130, and the two transfer chambers 102, 104. The controller 190 can include a central processing unit (CPU) 192, a memory 194, and support circuits 196, e.g., input/output circuitry, power supplies, clock circuits, cache, and the like. The memory 194 is connected to the CPU 192. The memory 194 is a non-transitory computer readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories. This architecture is adaptable to various embodiments of the processing platform 100 based on programming of the controller 190 to control the order and timing of the movement of the substrate to and from the chambers. In addition, the controller 190 also controls various process variables in each of the processing chambers 110, 112, 114, 116, 118, 130 and transfer chambers 102, 104, such as temperature, pressure and the like.

Figure 1B:
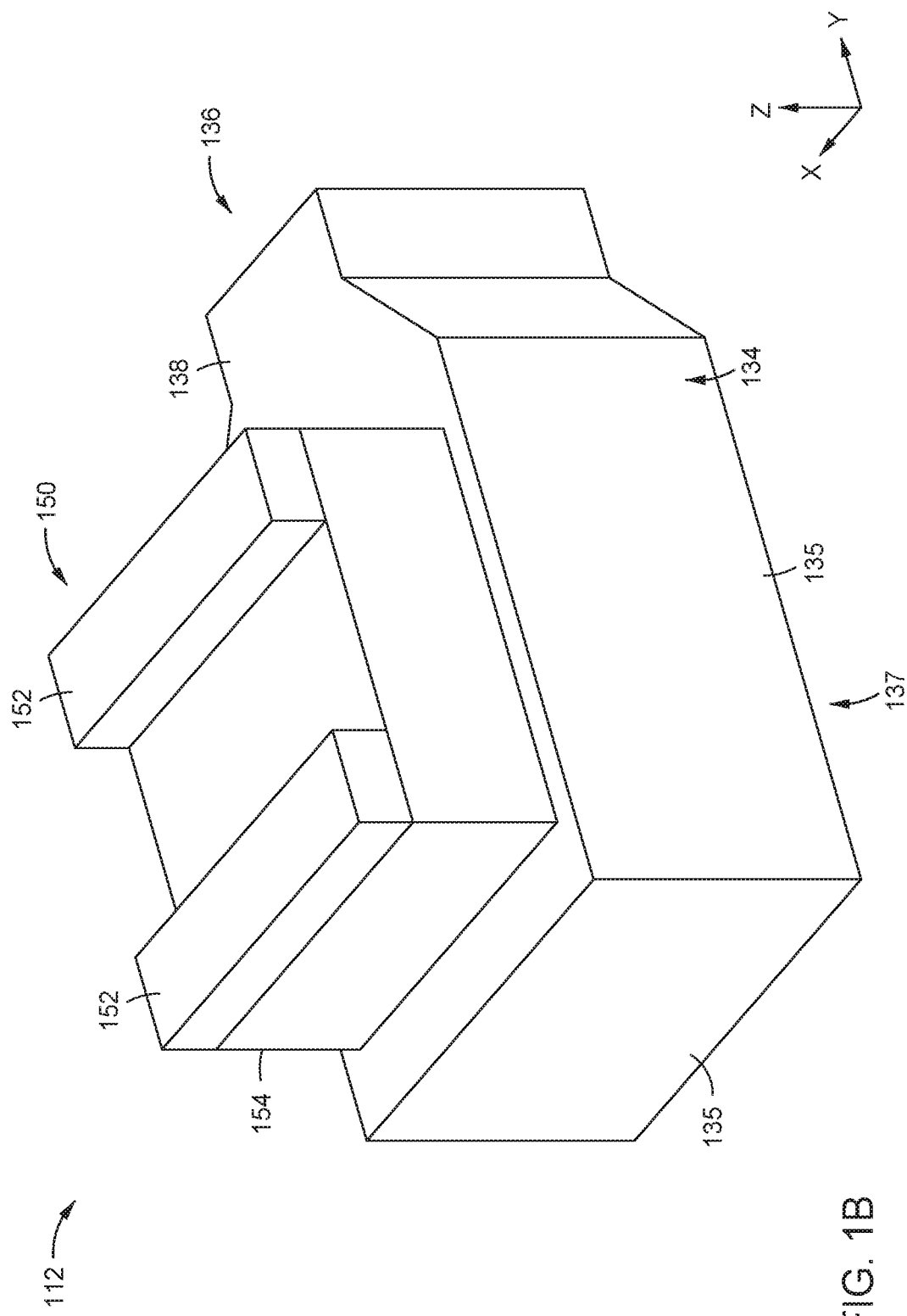
FIG. 1B illustrates an isometric top side view of a processing chamber, according to one embodiment.
Figure 1C:
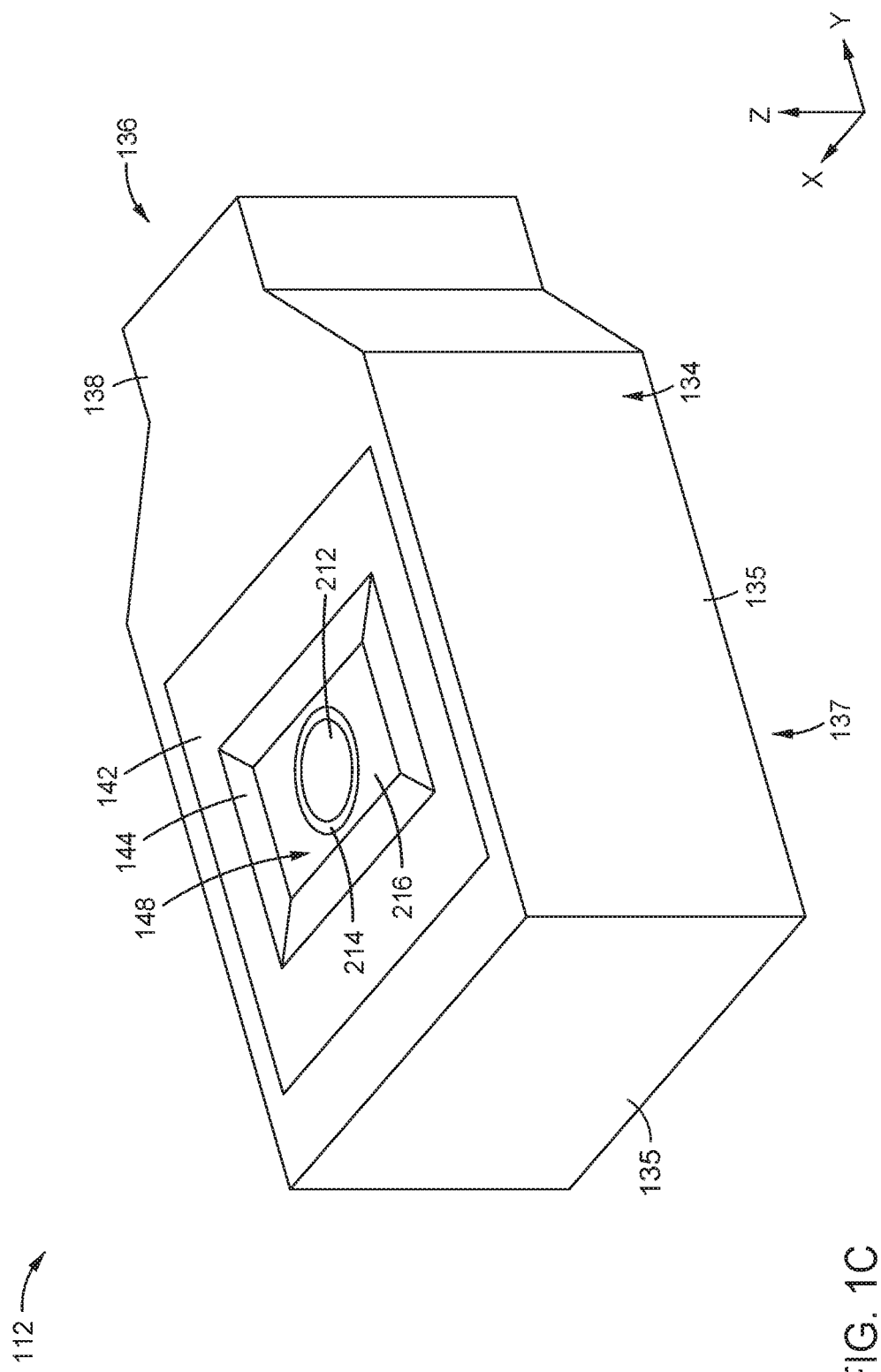
FIG. 1C illustrates an isometric top side view of a chamber body, according to one embodiment.

FIG. 1B illustrates an isometric top side view of processing chamber 112, according to one embodiment. As shown, processing chamber 112 includes a source assembly 150 and a chamber body 134. The source assembly 150 is separable from the chamber body 134. The source assembly 150 can be removed from the chamber body 134, in order to access an aperture 148 (FIG. 1C). The source assembly 150 is secured to the chamber body 134 during operation of the processing chamber 112.

FIG. 1C illustrates an isometric top side view of the chamber body 134, according to one embodiment. As shown, the chamber body 134 includes a top chamber surface 138, a top panel 142, a moveable substrate support 200 (FIG. 1D), a slot 136, a sloped portion 144, and an aperture 148. The chamber body 134 contains an interior volume 145 (FIG. 1D) that is at least partially bounded by the top chamber surface 138 above, chamber walls 135, and chamber bottom 137 of the chamber body 134. The interior volume 145 can include a low pressure region 324, as described below in FIG. 3A. The slot 136 is disposed in the side of the chamber body 134, which allows for motion of a substrate into and out of the chamber body.

The top chamber surface 138 can include the top panel 142. The top panel 142 is separable from the top chamber surface 138, according to one embodiment. A separable top panel 142 allows for easier cleaning of the removed top panel, instead of needing to clean the top panel while still installed in the chamber body 134. The top chamber surface 138 includes the aperture 148. The top chamber surface 138 includes the sloped portion 144, where the sloped portion at least partially surrounds the aperture 148. The top chamber surface 138, the top panel 142, and the sloped portion 144 can all be one solid piece, or top chamber surface 138, top panel 142, and sloped portion 144 can all be separate pieces.

FIG. 1D illustrates a schematic side view of the processing chamber 112 of FIG. 1B, according to one embodiment. As shown, source assembly 150 includes a plurality of pulley guards 152, a plurality of pulleys 191, a plurality of belts 193, a source 154 enclosing a plurality of cathode assemblies 312, and a plurality of target power sources 195. The plurality of cathode assemblies 312 each include a target 188 and a magnet 197. The material of the targets 188 includes a metal or a semiconductor. The material of the targets 188 includes titanium (Ti), according to one embodiment. The material of the targets 188 includes silicon (Si), according to one embodiment. The targets 188 can include metals, e.g., copper, aluminum, tantalum, cobalt, or any alloy of the same. The targets 188 can include a dielectric material. The targets 188 include a plurality of the target magnets 197. The plurality of target magnets 197 can be a fixed field magnetic strength, and each magnet 197 can be a different magnetic field strength. The target magnets 197 are electromagnets, and can be powered by the target power sources 195, according to one embodiment. The target magnets 197 are permanent magnets, according to one embodiment. The target power sources 195 can be located in the source assembly 150, or outside the source assembly. The powered target magnets 197 cause sputtering of the targets 188 through an electromagnetic interaction, which deposits material from the targets on a substrate through the aperture 148 below.

The targets 188 are cylindrical, according to some embodiments. The targets 188 can be connected to the pulleys 191 by the belts 193, and the targets 188 can be rotated by the pulleys during sputtering, according to one embodiment. The rotation of the targets 188 results in a more even erosion of the material from the targets 188 onto a substrate positioned below. The pulleys 191 are protected from the outside environment by the pulley guards 152. The pulley guards 152 protect the pulleys 191 from damage during assembly, disassembly, or functioning of the processing chamber 112.

In some embodiments, a process gas is provided by a gas flow source 351 during the sputtering process, and at least some of the process gas reacts with the sputtered material. In one embodiment, the process gas includes nitrogen gas ($N_2$), the material of the targets 188 includes Ti, and the material deposited on the substrate includes titanium nitride (TiN). In one embodiment, the process gas includes oxygen gas ($O_2$), the material of the targets 188 includes Ti, and the material deposited on the substrate includes titanium oxide ($TiO_x$). In one embodiment, the process gas includes nitrogen gas ($N_2$), the material of the targets 188 includes Si, and the material deposited on the substrate includes silicon nitride (SiN). In one embodiment, the process gas includes oxygen gas ($O_2$), the material of the targets 188 includes Si, and the material deposited on the substrate includes silicon oxide ($SiO_2$). The process gas can include a neutral gas, such as helium (He) or argon (Ar). The neutral gas maintains the desired pressure of the process gas. If a neutral gas is used, the neutral gas can sputter material from the targets 188 through ballistic interaction with the material of the target.

A top portion surface 144S of the sloped portion 144 is at an angle $\theta$ to the X-direction and the Y-direction, wherein the X-direction and Y-direction are substantially parallel to the top chamber surface 138. The angle $\theta$ ranges from about greater than 0° to about less than 90°, such as about 15° to about 35°, according to one embodiment. Deposition spray from the target 188 only deposits on the substrate at angles larger than the angle $\theta$. Different portions of the sloped portion 144 can have different angles, such as $\theta_1$ and $\theta_2$, as pictured in FIG. 1D.

The aperture 148 and the sloped portion 144 can be disposed in the top panel 142 if the top panel 142 is present. The aperture 148 can be any desired shape. The aperture 148 is rectangular, according to one embodiment. The aperture 148 is hourglass shaped, according to another embodiment. The top panel 142 can be swapped out for different deposition methods, with the shape of the aperture 148, the size of the aperture 148, and the angles $\theta$, $\theta_1$, $\theta_2$ of the sloped portion 144 varied with the desired deposition process. A chiller pump 140 supplies water or another fluid to the chamber 112 via supply plumbing 131 and from the chamber 112 via return plumbing 139. The chiller pump 140 supplies water or another fluid to the top panel 142, providing cooling to the top panel 142 and keeping the top panel 142 at the desired temperature. The temperature of the top panel 142 can be controlled from about −20° C. to about 100° C. In one embodiment, the top panel 142 includes aluminum (Al), and the fluid cooling prevents overheating of the top panel 142, and minimizes peeling and flaking of the deposition material. A vacuum pump 141 is connected to the chamber 112, and the vacuum pump 141 removes unwanted byproducts and exhaust from the processing chamber 112.

As shown, the moveable substrate support 200 includes a support actuator 220, a mounting flange 221, a support shaft 204, a robot actuator 222, a robot arm 206, a shaft 208, a robot wrist 210, and a support structure 250. The moveable substrate support 200 is disposed in the interior volume 145. The support actuator 220 is mounted to the chamber bottom 137 by the mounting flange 221. The support actuator 220 is connected to the support shaft 204. The support actuator 220 is configured to move the support shaft 204 vertically, which moves the rest of the moveable substrate support 200 vertically. The robot actuator 222 is attached to the support shaft 204. The robot arm 206 is connected to the robot actuator 222. The robot actuator 222 is configured to move the robot arm 206 horizontally. The shaft 208 is connected to the robot arm 206. The shaft 208 supports the robot wrist 210. The robot wrist 210 supports the support structure 250. The combination of vertical motion from the support actuator 220 and horizontal motion of the robot actuator 222 allows for moving the support structure 250 in three-dimensional space.

A substrate can be placed on the support structure 250. Transfer robots 106, 108 are configured to move the substrate from outside the chamber 112 into the chamber 112 through slot 136. The moveable substrate support 200 is configured to move the substrate from the slot 136 to near the aperture 148 for sputtering of material onto the substrate. In some embodiments, the slot 136 is not at an ideal vertical position for sputtering onto the substrate, and the moveable substrate support 200 moves the substrate higher or lower than the slot 136 to begin deposition. Different areas of the substrate that are not currently exposed by the aperture 148 can be reached by moving the support structure 250 horizontally and/or vertically during deposition processes.

As shown, the support structure 250 includes a substrate support surface 212, a ring 214, and a halo 216. The substrate support surface 212 is supported by the robot wrist 210. The substrate support surface 212 can include any material used in an electrostatic chuck. The substrate support surface 212 includes a ceramic material, e.g., aluminum oxide or boron nitride, according to one embodiment. The substrate support surface 212 can include metal, e.g., stainless steel. The substrate support surface 212 secures the substrate to the support structure 250. The ring 214 surrounds the substrate support surface 212, and the ring is connected to the robot wrist 210. The ring 214 can include a metal, such as, e.g., stainless steel, titanium, low coefficient of thermal expansion (CTE) alloys, or aluminum beryllium alloys. The halo 216 at least partially surrounds the ring 214, and the halo is connected to the ring 214. The halo 216 includes a metal, such as, e.g., stainless steel, titanium, low CTE alloys, or aluminum beryllium alloys. The halo 216 includes a pattern or stiffening elements that reduces strain in the halo. The pattern or stiffening elements can be indentations in the halo 216, such as an X or cross shape. The dimensions of the halo 216 are such that the aperture 148 is completely blocked by the support structure 250. The halo 216 prevents unwanted deposition of material on the other components of the moveable substrate support 200 below. The combination of the aperture 148 and halo 216 prevents deposition into the chamber 112, while still allowing deposition onto the substrate.

The support structure 250 can include a heater (not shown), a cooling apparatus (not shown), for example, a water cooling system, or both. The heater and/or the cooling apparatus controls the temperature of the support structure 250 and the substrate disposed on the support structure 250 to temperatures between about −20° C. and about 400° C., according to one embodiment. The support structure 250 includes an electrostatic chuck (ESC) (not shown), and the substrate is chucked to the ESC, according to one embodiment. The ESC provides an applied voltage to the substrate disposed on the support structure 250, according to one embodiment. The support structure 250 includes ports configured to provide a backside gas (not shown), and the backside gas is provided to the substrate, according to one embodiment. The backside gas can include a neutral gas, such as argon gas (Ar) or helium gas (He), according to one embodiment.

During sputtering, the moveable substrate support 200 moves the substrate along a movement path 202. The movement path 202 can be a smooth motion without pauses, or the movement path can include portions of the path wherein the support structure 250 is stationary. The movement path 202 is a linear movement as shown in FIG. 1D, according to one embodiment. The movement path 202 can be one direction, a back and forth direction, or containing multiple passes, according to some embodiments. The movement path 202 is a circular rotation about the aperture 148, according to one embodiment. The movement path 202 is such that the substrate support surface 212 is under the aperture 148 for at least a portion of the movement path. The movement path 202 is such that the substrate support surface 212 is not under the aperture 148 for at least a portion of the movement path, and at least a portion of the halo 216 is under the aperture for at least a portion of the movement path.

Figure 2A:
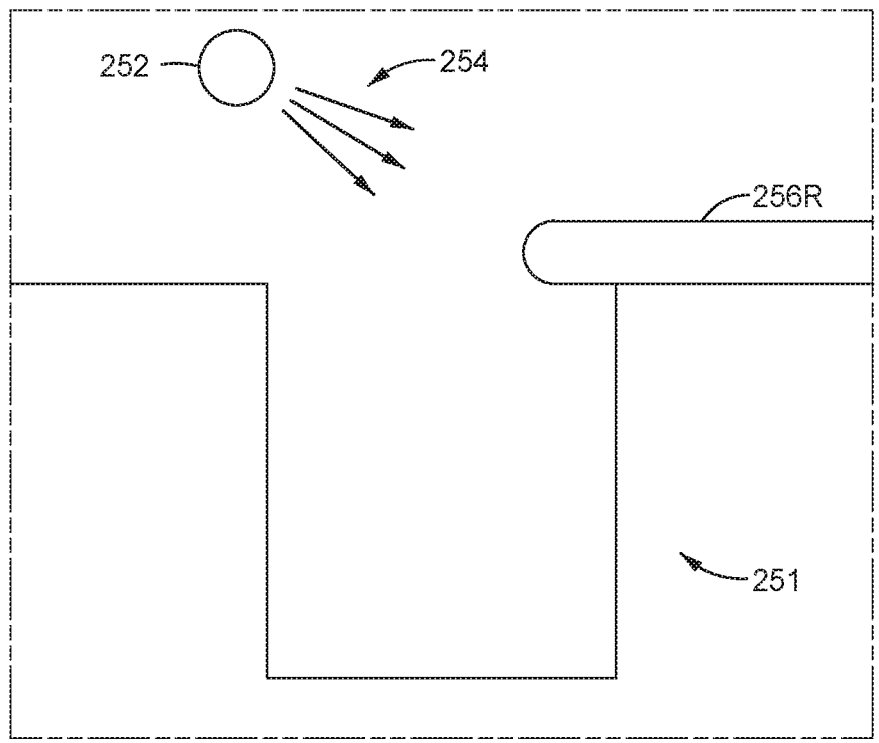
FIGS. 2A-B illustrate deposition of material in a semiconductor feature, according to one embodiment.

FIG. 2A illustrates deposition of material in a semiconductor feature 251, according to one embodiment. Sputtering source 252 sputters material spray 254 toward the semiconductor feature 251 through the aperture 148. In the illustration of FIG. 2A, the semiconductor feature 251 is located to the right of the source 252, and deposition 256R is only grown on the right side of the semiconductor feature, as the left side of the semiconductor feature is covered by the top panel 142. The sputtering source 252 can be the target 188 as described above.

Figure 2B:
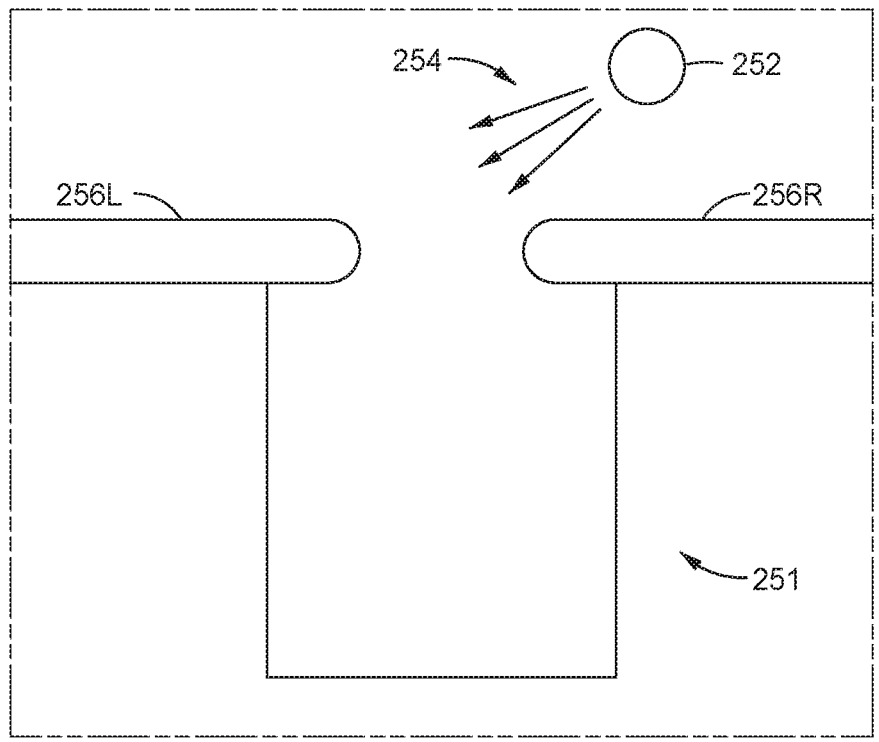

FIG. 2B illustrates deposition of material in a semiconductor feature 251, according to one embodiment. Sputtering source 252 sputters material spray 254 toward the semiconductor feature 251 through the aperture 148. In the illustration of FIG. 2B, the semiconductor feature 251 is located to the left of the source 252, and deposition 256L is only grown on the left side of the semiconductor feature, as the left side of the semiconductor feature is covered by the top panel 142. In both cases, little to no material is deposited on the bottom of the semiconductor feature 251. The sputtering source 252 can be the target 188 as described above.

Figure 3A:
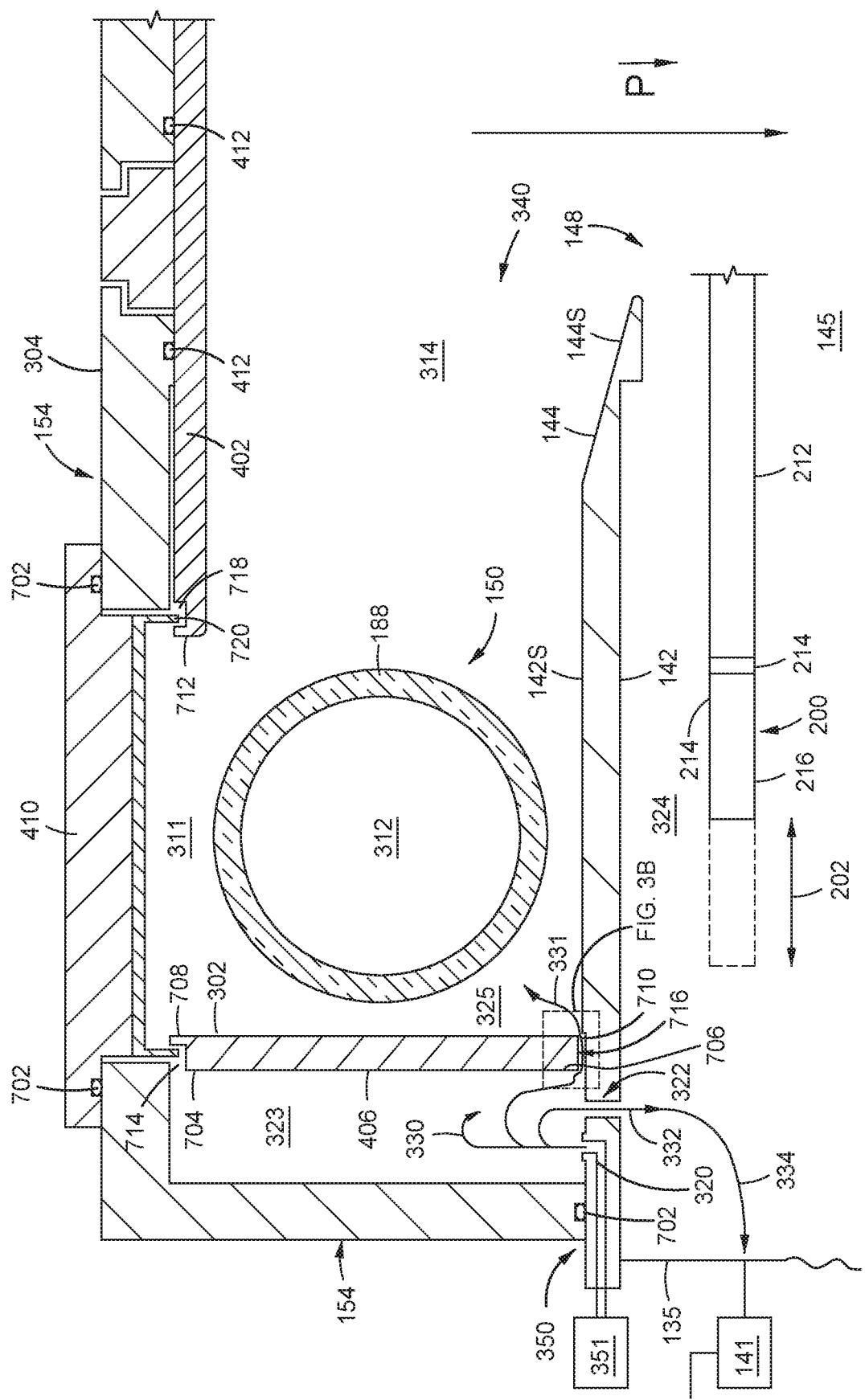
FIG. 3A illustrates a partial cross-sectional view of a shield kit installed inside the source, according to one embodiment.

FIG. 3A illustrates a partial cross-sectional view of a shield kit 302 installed inside the source 154 on the top panel 142, according to one embodiment. As shown, the shield kit 302 includes a top plate 402, and a plurality of mounting plates 410. The processing system 340 includes a gas flow system 350 and the moveable substrate support 200 (FIG. 1D). The top plate 402 is positioned beneath a top face 304 of the source 154 between an adjacent pair of a plurality of cathode openings 311. On the top plate 402, a vacuum seal 412 that seals between the top plate 402 of the shield kit 302 and the top face 304 of the source 154.

The plurality of pulleys 191 and the pulley guards 152 of the source assembly 150 (shown in FIG. 1D) are secured on a plurality of mounting plates 410. A plurality of cathode assemblies 312 is installed inside the internal volume 314 of the shield kit 302. The plurality of cathode openings 311 of the source 154 is vacuum sealed with the mounting plate seal 702 beneath the mounting plate 410. At a top end 704 and a bottom end 706 of a side plate 406, torturous path 710 is formed.

As shown, the gas flow system 350 comprises a gas flow source 351, one or more gas inlets 320, one or more gas outlets 322, a gas flow region 323, a low pressure region 324, a high pressure region 325, a gap 716, and a vacuum pump 141. The one or more gas inlets 320, one or more gas outlets 322, and gap 716 are flow sections between various regions of the system. The one or more gas inlets 320 are fluidly coupleable to the gas flow source 351. The one or more gas inlets 320 are fluidly coupled to the gas flow source 351, according to one embodiment. The gas flow region 323 is fluidly coupled to the one or more gas inlets 320 and the one or more gas outlets 322. The gas flow region 323 is formed between the source 154 and the side plate 406, according to one embodiment. The high pressure region 325 is fluidly coupled to the gas flow region 323 through the gap 716 between a first plate and a second plate. The first plate is, for example, the side plate 406, and the second plate is, for example, the top panel 142.

The high pressure region is maintained at a pressure of about 1 Torr to about 10 Torr. A pressure gauge 149 (FIG. 1D) is fluidly coupled to a flow pipe 147, the flow pipe is fluidly coupled to an elbow path 146, and the elbow path is fluidly coupled to the high pressure region 315, according to one embodiment. The pressure gauge 149 monitors the pressure of the high pressure region 325, and allows for feedback control of the gas flow system 350. If sputtered material from the target 188 enters the elbow path 146, the material bounces several times and forms redeposits on the walls of the elbow path, and this does not deposit on the pressure gauge 149, which interferes with the functioning of the pressure gauge. The side plate 406 separates the gas flow region 323 from the high pressure region 325, and the gap 716 is formed between the bottom end 706 of the side plate 406 and the top surface 142S of the top panel 142, according to one embodiment. The low pressure region 324 is fluidly coupled to the gas flow region 323 through the one or more gas outlets 322. The low pressure region 324 is maintained at a pressure as low as possible, such as about $1\times10^{-4}$ Torr to about $1\times10^{-10}$ Torr.

The shield kit 302 includes specific parts configured and assembled to provide tortuous paths 708, 710, 712. It is believed that by the time the material from the target 188 bounces twice, a negligible amount of the material is left to pass through the tortuous paths 708, 710, 712. The tortuous paths 708, 710, 712 provide a path for process gas flow, while simultaneously at least partially preventing the movement of sputtered material through the tortuous paths. The torturous paths 708, 710, and 712 respectively prevent deposition of material from the target 188 on inner surfaces of the source 154 via a gap 714 between the top end 704 and the mounting plate 410, a gap 716 between the bottom end 706 and the top panel 142, and a gap 718 between the top plate 402 and the mounting plate 410. For example, the material from the target 188 may bounce at the torturous path 712 and further bounce at a tip 720 of the mounting plate seal 702. It is believed that by the time the material from the target 188 bounces twice, a negligible amount of the material is left to pass through the gap 718. Thus, with the torturous paths 708, 710, and 712, the inner surfaces of the source 154 are protected from deposition of the material from the target 188 thereon.

The top panel 142 separates the high pressure region 325 from the low pressure region 324, and the moveable substrate support 200 is disposed in the low pressure region 324, according to one embodiment. The one or more gas inlets 320 and the one or more gas outlets 322 are disposed in the top panel 142, according to one embodiment. The vacuum pump 141 is fluidly coupled to the low pressure region 324, and the vacuum pump is configured and operated to maintain a low pressure in the low pressure region, according to one embodiment. The rate of gas flow from the gas flow source 351 and the operation of the vacuum pump 141 maintains a pressure gradient (indicated by P in FIG. 3A, where the arrow points from area of highest pressure to lowest pressure) between the high pressure region 325 and the low pressure region 324, according to one embodiment. Changes in conductance of the internal volume 314 and high pressure region 325 occur due to movement of the moveable substrate support 200 across the aperture 148, causing the moveable substrate support 200 to block a portion of the aperture 148. These changes in conductance are managed by operation of the vacuum pump 141 and the gas flow source 351. The pressure in the gas flow region 323, high pressure region 325, and low pressure region 324 is controlled by the flow rate and conductance of the process gas. The conductance of the process gas is controlled by the cross sectional area of each flow section separating the regions from one another. For example, the pressure in the high pressure region 325 and the gas flow region 323 is controlled by the cross sectional area of the gap 716, which controls the conductance of the process gas contained therein.

To prevent the pressure in the gas flow region 323 from getting too high, such that components surrounding the gas flow region begin to sustain damage from stress caused by the high pressure, the one or more gas outlets 322 allow a flow of the process gas into the low pressure region 324, relieving pressure in the gas flow region. The flow of process gas through the one or more gas outlets 322 is controlled by the cross sectional area of the gas outlets. The size of the gas outlets 322 is designed such that the flow of process gas is from about 5 sccm to about 50 sccm. If the gas outlets 322 are the wrong size, the gas flow is too low (less than about 5 sccm) to easily be controlled by an automatic flow control valve or mass flow controller (MFC) (not shown). Any excess gas vented in this manner can be pumped out by the vacuum pump 141, maintaining the low pressure in the low pressure region 324. The low pressure region 324 and the high pressure region 325 are fluidly coupled through the aperture 148, according to one embodiment. During functioning and motion of the moveable substrate support 200, a portion of the moveable substrate support does not cover at least one of the gas inlets 320 or at least one of the gas outlets 322 along any portion of the movement path 202, according to one embodiment. During functioning and motion of the moveable substrate support 200, a portion of the moveable substrate support does not cover any of the gas inlets 320 or any of the gas outlets 322 along any portion of the movement path 202, according to one embodiment. The one or more gas inlets 320 and the one or more gas outlets 322 can be located in the corners of the source 154 and disposed in the top panel 142.

The flow of the process gas through the gas flow system 350 is shown in FIG. 3A for an embodiment including the vacuum pump 141. The process gas flows from the gas flow source 351 through the one or more gas inlets 320 into the gas flow region 323 (flow shown by arrow 330). Some of the process gas (flow shown by arrow 331) flows through the gap 716 into the high pressure region 325. However, some of the process gas (flow shown by arrow 332) flows through the one or more gas outlets 322 into the low pressure region 324. The process gas flow (shown by arrow 332) can be due to venting of the gas flow region 323, preventing the unwanted buildup of high pressure of the gas flow region. The process gas flow (shown by arrow 332) can also be due to random thermal fluctuations of the process into the low pressure region 324, or due to the pressure disparity between the gas flow region 323 and the low pressure region. In any case, the vacuum pump 141 pumps the process gas, causing a flow (shown by arrow 334) into the vacuum pump, removing process gas from the low pressure region 324, and maintaining the desired low pressure in the low pressure region.

Figure 3B:
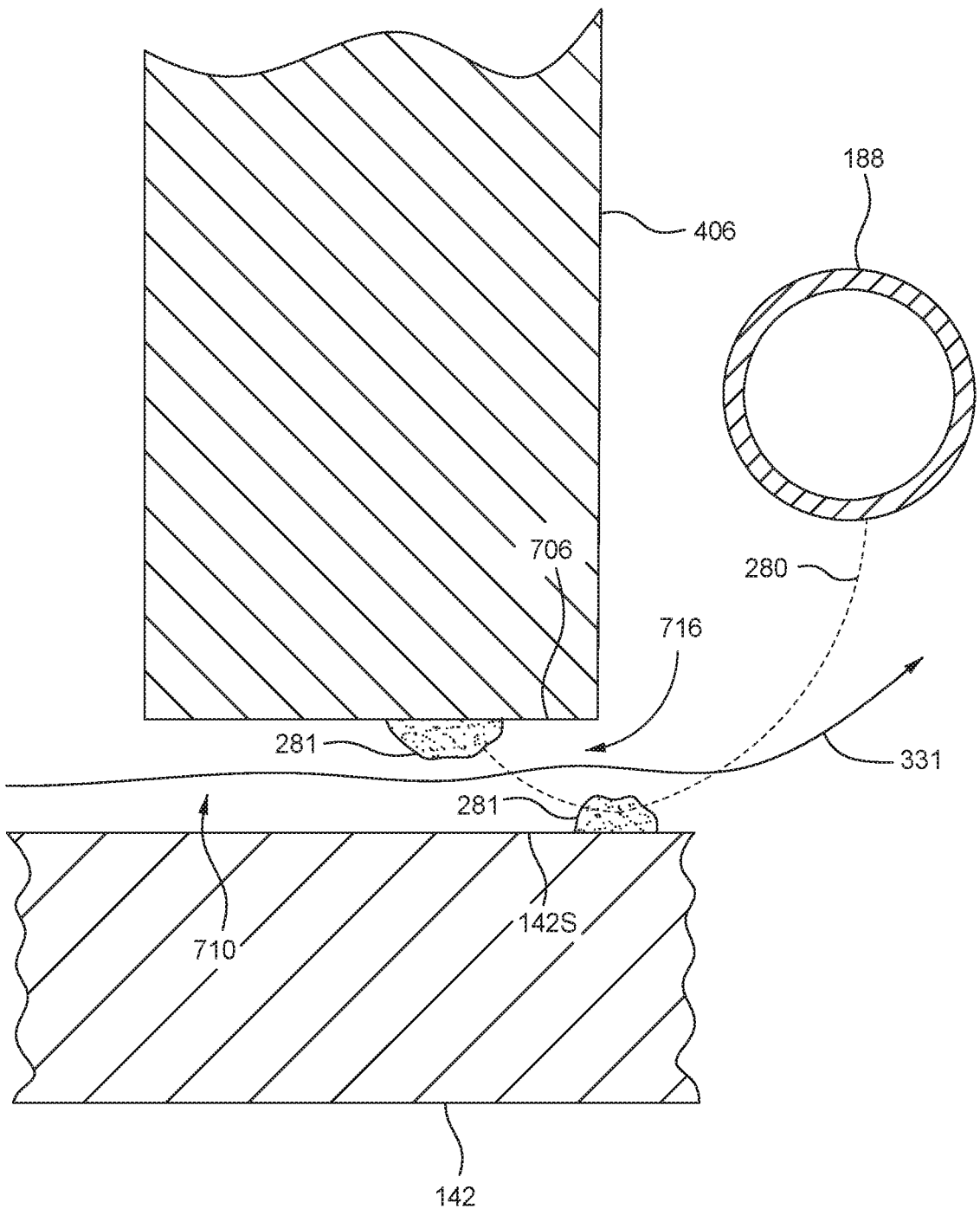
FIG. 3B illustrates a zoomed-in view of a torturous path formed in the gap between a bottom end of a side plate and a top surface of a top panel, according to one embodiment.

FIG. 3B illustrates a zoomed-in view of the torturous path 710 formed in the gap 716 between the bottom end 706 of the side plate 406 and the top surface 142S of the top panel 142, according to one embodiment. The tortuous path 710 is the channel formed between the bottom end 706 of the side plate 406 and the top surface 142S of the top panel 142. As shown, the channel does not include any features, but it is contemplated that the channel could include additional features that sputtered material redeposits onto or into, instead of the sputtered material passing through the entire tortuous path 710. The features could include crevices, sloped portions, channels, tunnels, and the like disposed in the top panel and the side plate 406.

The torturous path 710 prevents deposition of material from the target 188 on inner surfaces of the source 154 via the gap 716. For example, the sputtered material from the target 188 (path shown by 280) can bounce at the torturous path 710 and form redepositions 281. It is believed that by the time the material from the target 188 bounces twice, a negligible amount of the material is left to pass through the gap 716. Thus, the torturous path 710 protects the inner surfaces of the source 154 from deposition of the material from the target 188 thereon. However, at least the gap 716 allows the flow of process gas from the gas flow region to the high pressure region 325, while blocking unwanted deposition from the target 188.

The process gas in the high pressure region 325 allows for functioning of the targets 188, and thus the proper deposition on the substrate through the aperture 148. For example, if the process gas includes Ar, ballistic interaction with the targets 188 allows for sputtering of the target 188 onto the substrate. If the process gas includes $N_2$ or $O_2$, a chemical interaction between the process gas and the target 188 contributes to the sputtering of chemically reacted material onto the substrate.

As described above, the gas flow system 350 includes a low pressure region 324 fluidly coupled to a gas flow region 323 by one or more gas outlets 322, and a high pressure region 325 fluidly coupled to the gas flow region by a gap 716. The gas flow source 351 provides process gas at a desired pressure to the gas flow region 323, and the fluid coupling between the gas flow region and the remainder of the gas flow system 350 maintains high pressure in the high pressure region 325 and low pressure in the low pressure region 324.

The high pressure region 325 near the targets 188 allows for the desired pressure for proper interaction between the process gas and the target 188, such that the desired material is sputtered onto the substrate. The low pressure region 324 near the substrate prevents unwanted interaction between the process gas and the substrate, which inhibits desired film growth. The one or more gas outlets 322 provide a release valve for the gas flow region 323, resolving the pressure in the gas flow region if it gets too high, which prevents damage to the components surrounding the gas flow region from pressure-induced stress and damage. The high pressure region 325 distributes the process gas more uniformly along the gas flow system 350 due to the large conductance of the process gas in the large volume of the high pressure region.

While the foregoing is directed to implementations of the present invention, other and further implementations of the invention may be devised without departing from the basic scope thereof, and the scope thereof is determined by the claims that follow.

We claim:
1. A gas flow system, comprising:
one or more gas inlets fluidly coupleable to a gas flow source;
one or more gas outlets;
a gas flow region, wherein the gas flow region is fluidly coupled to the one or more gas inlets and the one or more gas outlets;

a low pressure region, wherein the low pressure region is fluidly coupled to the one or more gas outlets;
a high pressure region fluidly coupled to the gas flow region via a gap between a first plate and a second plate, wherein the first plate separates the gas flow region from the high pressure region;
an elbow path fluidly coupled to the high pressure region;
a flow pipe fluidly coupled to the elbow path; and
a pressure gauge fluidly coupled to the flow pipe, the pressure gauge configured to measure pressure in the high pressure region.

2. The gas flow system of claim 1, wherein the gap is formed between a bottom end of the first plate and a top surface of the second plate, and wherein the second plate separates the high pressure region from the low pressure region.

3. The gas flow system of claim 1, further comprising:
the gas flow source fluidly coupled to the gas flow region via the one or more gas inlets;
and a vacuum pump fluidly coupled to the low pressure region, the vacuum pump configured to maintain low pressure in the low pressure region.

4. The gas flow system of claim 3, wherein a rate of gas flow from the gas flow source and the vacuum pump are controlled to maintain a pressure gradient between the high pressure region and the low pressure region.

5. The gas flow system of claim 3, wherein a process gas supplied by the gas flow source comprises argon gas (Ar).

6. The gas flow system of claim 3, wherein a process gas supplied by the gas flow source comprises nitrogen gas ($N_2$) or oxygen gas ($O_2$).

7. The gas flow system of claim 1, wherein an aperture is disposed in the second plate, wherein the second plate is a top panel separating the high pressure region from the low pressure region, and wherein the aperture fluidly couples the low pressure region and the high pressure region.

8. A processing system, comprising:
a gas flow system, comprising:
a gas flow source;
one or more gas inlets, wherein the one or more gas inlets are fluidly coupled to the gas flow source;
one or more gas outlets;
a gas flow region, wherein the gas flow region is fluidly coupled to the one or more gas inlets and the one or more gas outlets;
a low pressure region, wherein the low pressure region is fluidly coupled to the one or more gas outlets;
a high pressure region fluidly coupled to the gas flow region via a gap between a first plate and a second plate, wherein the first plate separates the gas flow region from the high pressure region;
an elbow path fluidly coupled to the high pressure region;
a flow pipe fluidly coupled to the elbow path; and
a pressure gauge fluidly coupled to the flow pipe, the pressure gauge configured to measure pressure in the high pressure region; and
a moveable substrate support disposed in the low pressure region, wherein the moveable substrate support is configured to move along a movement path.

9. The processing system of claim 8, wherein the gas flow system further comprises a vacuum pump fluidly coupled to the low pressure region, the vacuum pump configured to maintain low pressure in the low pressure region.

10. The processing system of claim 9, wherein a rate of gas flow from the gas flow source and the vacuum pump are controlled to maintain a pressure gradient between the high pressure region and the low pressure region.

11. The processing system of claim 8, wherein the moveable substrate support comprises:
a support structure, comprising:
a substrate support surface;
a ring, the substrate support surface surrounded by the ring; and
a halo;
a robot arm, the robot arm connected to the support structure; and
a robot actuator connected to the robot arm, wherein the robot actuator is configured to move the robot arm and the substrate support surface along the movement path.

12. The processing system of claim 8, wherein the gap is formed between a bottom end of the first plate and a top surface of the second plate, and wherein the second plate separates the high pressure region from the low pressure region.

13. The processing system of claim 8, wherein a portion of the moveable substrate support does not cover at least one of the gas inlets or at least one of the gas outlets along any portion of the movement path.

14. A processing chamber, comprising:
a gas flow system, comprising:
a gas flow source;
one or more gas inlets, wherein the one or more gas inlets are fluidly coupled to the gas flow source;
one or more gas outlets;
a gas flow region, wherein the gas flow region is fluidly coupled to the one or more gas inlets and the one or more gas outlets;
a low pressure region, wherein the low pressure region is fluidly coupled to the one or more gas outlets;
a high pressure region fluidly coupled to the gas flow region via a gap;
an elbow path fluidly coupled to the high pressure region;
a flow pipe fluidly coupled to the elbow path; and
a pressure gauge fluidly coupled to the flow pipe, the pressure gauge configured to measure pressure in the high pressure region;
a moveable substrate support, comprising:
a support structure, comprising:
a substrate support surface;
a ring, the substrate support surface surrounded by the ring; and
a halo;
a robot arm, the robot arm connected to the support structure; and
a robot actuator connected to the robot arm, wherein the robot actuator is configured to move the robot arm and the substrate support surface along a movement path;
a top panel having an aperture disposed therethrough, the top panel separating the high pressure region from the low pressure region, the aperture fluidly coupling the high pressure region to the low pressure region, and the gap being formed between the top panel and a side plate separating the gas flow region from the high pressure region;
one or more chamber walls; and
a chamber bottom, wherein an interior volume is at least partially bounded by the top panel, one or more chamber walls, and the chamber bottom, the moveable substrate support disposed within the interior volume, and wherein the interior volume contains the low pressure region.

15. The processing chamber of claim 14, wherein the gap is formed between a bottom end of the side plate and a top surface of the top panel.

16. The processing chamber of claim 14, wherein the gas flow system further comprises a vacuum pump fluidly coupled to the low pressure region, the vacuum pump configured to maintain low pressure in the low pressure region.

17. The processing chamber of claim 16, wherein a rate of gas flow from the gas flow source and the operation of the vacuum pump are controlled to maintain a pressure gradient between the high pressure region and the low pressure region.

18. The processing chamber of claim 14, wherein a portion of the moveable substrate support does not cover at least one of the gas inlets or at least one of the gas outlets along any portion of the movement path.

19. The processing chamber of claim 14, wherein the movement path is approximately a straight line.

\* \* \* \* \*